US009607118B1

(12) United States Patent
Balasubramanian et al.

(10) Patent No.: US 9,607,118 B1
(45) Date of Patent: *Mar. 28, 2017

(54) EVALUATING ON-CHIP VOLTAGE REGULATION

(71) Applicant: International Business Machines Corporation, Armonk, NY (US)

(72) Inventors: Raju Balasubramanian, Austin, TX (US); Erich C. Schanzenbach, Dover Plains, NY (US); Howard H. Smith, Beacon, NY (US); Anurag P. Umbarkar, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/132,402

(22) Filed: Apr. 19, 2016

Related U.S. Application Data

(63) Continuation of application No. 14/975,927, filed on Dec. 21, 2015.

(51) Int. Cl.
*G06F 17/50* (2006.01)
*G06F 17/10* (2006.01)

(52) U.S. Cl.
CPC .......... *G06F 17/5036* (2013.01); *G06F 17/10* (2013.01)

(58) Field of Classification Search
CPC ......... H01L 2924/0002; H01L 2924/00; H01L 2224/49171; H01L 25/072; G06F 17/5072; G06F 17/5036; G06F 17/505; G06F 17/5081; G06F 1/04; G06F 1/26; G06F 1/3203; G06F 2217/04; G06F 2217/78; G06F 17/50; G06F 17/5009; G06F 17/5045

(Continued)

(56) References Cited

U.S. PATENT DOCUMENTS 5,847,965 A   12/1998  Cheng
7,301,313 B1  11/2007  Hart et al.
(Continued)

FOREIGN PATENT DOCUMENTS

WO    9849761 A1   11/1998

OTHER PUBLICATIONS

Zhou et al., "A Self-Driven Soft-Switching Voltage Regulator for Future Microprocessors", IEEE Transactions on Power Electronics, vol. 20, No. 4, Jul. 2005, pp. 806-814, © 2005 IEEE.

(Continued)

*Primary Examiner* — Binh Tat
(74) *Attorney, Agent, or Firm* — Nicholas D. Bowman

(57) ABSTRACT

A linear circuit simulator can be supplied with a linear power distribution model of an integrated circuit (IC) and two sets of voltage regulator equivalent resistances. The linear circuit simulator can then be used to calculate two voltages, at a sense point of the IC, corresponding to the two sets of voltage regulator equivalent resistances. The two sets of voltage regulator equivalent resistances and the two voltages at the IC sense point can be used to interpolate a slope of a resistance versus voltage curve of the linear power distribution model. The slope can be used to calculate an updated set of voltage regulator equivalent resistances, which can be used by the linear circuit simulator to calculate a set of performance metrics and an updated voltage at the sense point of the IC.

1 Claim, 5 Drawing Sheets

(58) Field of Classification Search
USPC .................................................. 716/100–109
See application file for complete search history.

(56) References Cited

U.S. PATENT DOCUMENTS

| | | | |
|---|---|---|---|
| 7,619,398 | B2 | 11/2009 | Barrows et al. |
| 8,028,531 | B2 | 10/2011 | Phan et al. |
| 8,572,544 | B2 | 10/2013 | Durbha et al. |
| 8,689,023 | B2 | 4/2014 | Gupta et al. |
| 2006/0031795 | A1 | 2/2006 | Rahmat et al. |
| 2009/0033155 | A1 | 2/2009 | Kanno et al. |
| 2010/0169848 | A1* | 7/2010 | Nahmanny ......... G06F 17/5063 716/103 |
| 2010/0199237 | A1* | 8/2010 | Kim .................... G06F 17/5036 716/103 |
| 2012/0331431 | A1* | 12/2012 | Batarseh ............... G06F 3/0483 716/102 |
| 2015/0054575 | A1 | 2/2015 | Bulzacchelli et al. |

OTHER PUBLICATIONS

Balasubramanian et al., "Evaluating On-Chip Voltage Regulation", U.S. Appl. No. 14/975,927, filed Dec. 21, 2015.
List of IBM Patents or Patent Applications Treated as Related, Jun. 16, 2016, 2 pages.

* cited by examiner

EVALUATING ON-CHIP VOLTAGE REGULATION

BACKGROUND

The present disclosure generally relates to voltage regulation of an integrated circuit (IC). In particular, this disclosure relates to the evaluation of on-chip voltage regulation schemes through the use of a linear circuit simulator.

An IC, also known as a silicon, or computer "chip", is a specially prepared piece of silicon or other semiconductor material, into which a complex electronic circuit is etched and formed using a photolithographic process. ICs can contain or include computer processors, memory, analog, and customizable devices. ICs can be relatively fragile, and therefore are often mounted on and/or surrounded by a protective, supportive ceramic or plastic package. Electrical connections with the chip can be provided through metal contacts, which can include pins or solder balls located on the exterior of the chip package.

ICs can have certain advantages over comparable discrete circuits, such as relatively low cost and high performance. The relatively low cost of an IC can result from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit, due to the high density and relatively low electrical interconnect parasitics between active devices such as transistors. Types of ICs may include analog, digital and "mixed signal" chips, i.e., chips that incorporate both analog and digital functions on the same silicon die.

SUMMARY

Embodiments may be directed towards a method. The method may include supplying, to a linear circuit simulator, a linear power distribution model of an integrated circuit (IC) and a first set of voltage regulator equivalent resistances and calculating, with the linear circuit simulator, a first voltage at a sense point of the IC, the first voltage corresponding to the first set of voltage regulator equivalent resistances. The method may also include supplying, to the linear circuit simulator, a second set of voltage regulator equivalent resistances and calculating, with the linear circuit simulator, a second voltage at the sense point of the IC, the second voltage corresponding to the second set of voltage regulator equivalent resistances. The method may also include interpolating, using the first set and the second set of voltage regulator equivalent resistances and the first and second voltages at the sense point of the IC, a slope of a resistance versus voltage curve of the linear power distribution model. The method may also include calculating, using the slope of the resistance versus voltage curve, an updated set of voltage regulator equivalent resistances and calculating, with the linear circuit simulator, the linear circuit simulator supplied with the updated set of voltage regulator equivalent resistances, a set of performance metrics and an updated voltage at the sense point of the IC.

Embodiments may also be directed towards an electronic system. The electronic system may include a linear circuit simulator, a linear power distribution model of an IC, and a first set of voltage regulator equivalent resistances. The electronic system may also include at least one processor circuit configured to supply, to the linear circuit simulator, the linear power distribution model of an IC and the first set of voltage regulator equivalent resistances. The at least one processor circuit may also be configured to calculate, with the linear circuit simulator, a first voltage at a sense point of the IC, the first voltage corresponding to the first set of voltage regulator equivalent resistances. The at least one processor circuit may also be configured to supply, to the linear circuit simulator, a second set of voltage regulator equivalent resistances and calculate, with the linear circuit simulator, a second voltage at the sense point of the IC, the second voltage corresponding to the second set of voltage regulator equivalent resistances. The at least one processor circuit may also be configured to interpolate, using the first set and the second set of voltage regulator equivalent resistances and the first and second voltages at the sense point of the IC, a slope of a resistance versus voltage curve of the linear power distribution model and calculate, using the slope of the resistance versus voltage curve, an updated set of voltage regulator equivalent resistances. The at least one processor circuit may also be configured to calculate, with the linear circuit simulator, the linear circuit simulator supplied with the updated set of voltage regulator equivalent resistances, a set of performance metrics and an updated voltage at the sense point of the IC.

Embodiments may also be directed towards a computer program product. The computer program product may include at least one computer readable storage medium having program instructions embodied therewith, wherein the at least one computer readable storage medium is not a transitory signal per se. The program instructions may be executable by at least one computer processor circuit to cause the at least one computer processor circuit to perform a method. The method may include supplying, to a linear circuit simulator, a linear power distribution model of an IC and a first set of voltage regulator equivalent resistances and calculating, with the linear circuit simulator, a first voltage at a sense point of the IC, the first voltage corresponding to the first set of voltage regulator equivalent resistances. The method may also include supplying, to the linear circuit simulator, a second set of voltage regulator equivalent resistances and calculating, with the linear circuit simulator, a second voltage at the sense point of the IC, the second voltage corresponding to the second set of voltage regulator equivalent resistances. The method may also include interpolating, using the first set and the second set of voltage regulator equivalent resistances and the first and second voltages at the sense point of the IC, a slope of a resistance versus voltage curve of the linear power distribution model. The method may also include calculating, using the slope of the resistance versus voltage curve, an updated set of voltage regulator equivalent resistances and calculating, with the linear circuit simulator, the linear circuit simulator supplied with the updated set of voltage regulator equivalent resistances, a set of performance metrics and an updated voltage at the sense point of the IC.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
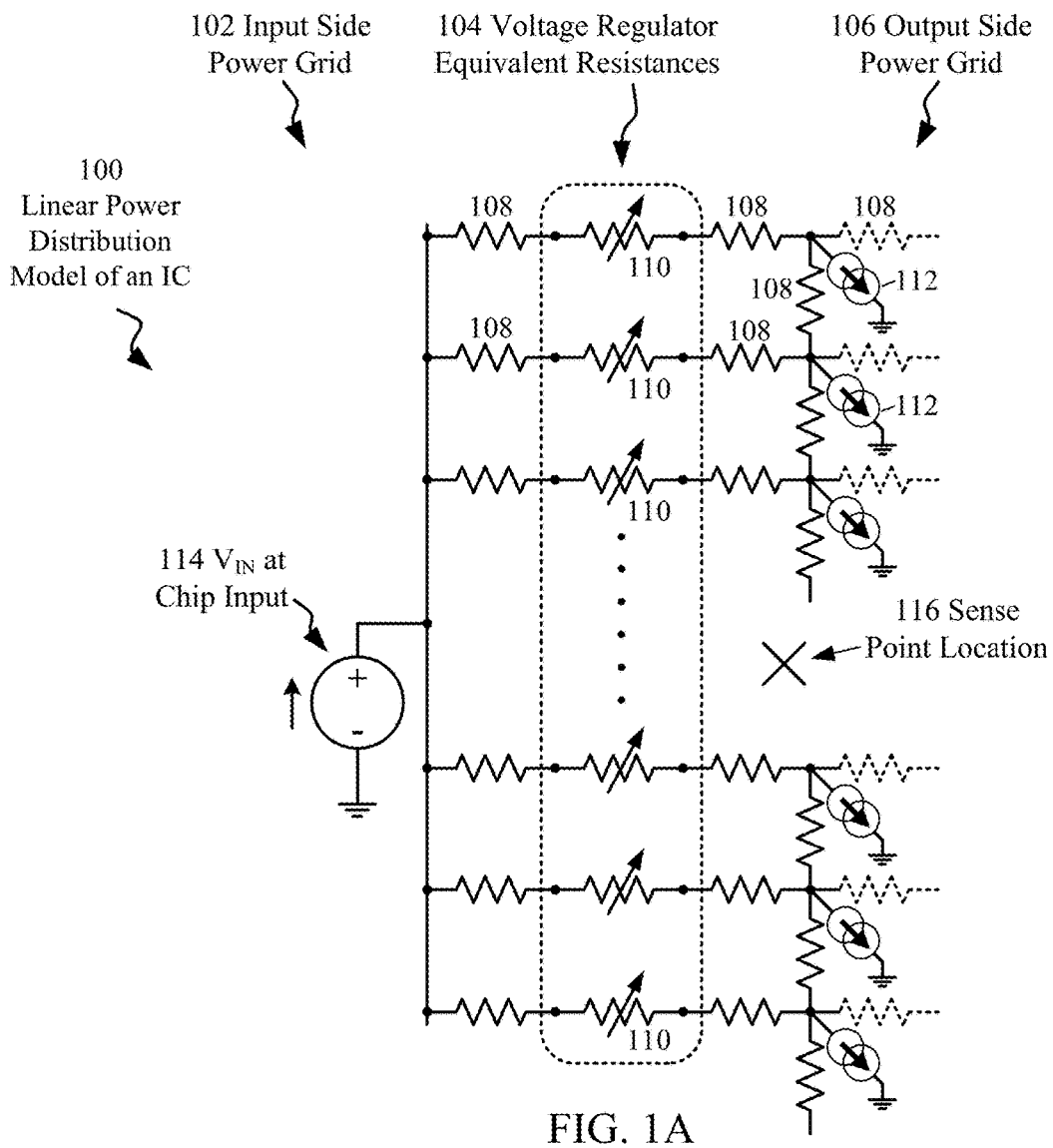
FIG. 1A is a schematic that depicts a linear power distribution model of an IC, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing enhanced, rapid evaluation of on-chip voltage regulation schemes for digital integrated circuits (ICs) such as processor chips, which may be used to provide computational capability for electronic systems such as computers, servers and network devices. Such electronic systems may include, but are not limited to personal computers, commercial computing systems, supercomputers, high-performance and special-purpose computing systems. While not necessarily limited thereto, embodiments discussed in this context can facilitate an understanding of various aspects of the disclosure. Certain embodiments may also be directed towards other equipment and associated applications, such as providing enhanced, rapid evaluation of on-chip voltage regulation schemes for analog ICs such as amplifier, filter and radio-frequency (RF) chips, which may be used in a wide variety of signal conditioning and processing applications. Such applications may include, but are not limited to, communications, medical instrumentation, diagnostic, environmental sensor, and other types of special-purpose electronic systems. Embodiments may also be directed towards enhanced, rapid evaluation of on-chip voltage regulation schemes for mixed-signal ICs. The circuit simulation techniques described herein involving the modeling of an active circuit such as a voltage regulator with an equivalent resistance may be known or referred to as "macromodeling" techniques for linear circuit evaluation.

Electronic devices on an IC are generally designed to be operated within a specified minimum/maximum supply voltage range. Various performance characteristics of such devices may have specified operation ranges that depend upon the supply voltage remaining within its specified range. For example the propagation delay, output rise and fall times, and output voltage levels of a digital logic device such as a gate or logic macrocell typically all depend on the supply voltage that the logic device receives remaining within its specified range. Similarly, output characteristics such as signal amplitude, signal frequency and jitter of analog devices likewise depend upon an analog supply voltage remaining within its specified range.

Electronic devices such as logic and/or analog circuits on an IC can be connected to a supply voltage external to the IC through a number of interconnected on-chip wires, also known as a "power grid". The power grid is generally connected to a supply voltage through one or more IC external power supply pins or connections, and is used to distribute power to many active, e.g., logic or analog, devices within the IC. Each of the conductive elements, i.e., wires, of the power grid is resistive, which results in a voltage drop across the grid as current is drawn through it by connected electronic devices. This voltage or "IR" drop between an external IC power supply pin and the active electronic devices on the IC can cause the supply voltage received by the devices to vary out of its specified range, which may in turn result in the device's operating or output characteristics also being out of their specified ranges. The supply voltage present at various locations of the power grid may depend on the current drawn by the electronic devices connected at various locations across the grid, and may vary over time based upon the dynamic current drawn by these devices.

In order to maintain the supply voltage received by all the electronic devices connected to the power grid within the specified range, various regulation schemes may be employed. For example, an off-chip voltage regulator may be connected to an IC voltage supply pin, and used to keep the voltage at this pin within its specified range. However, due to the power grid IR drop discussed above, this scheme may result in voltages out of the specified range being received at various electronic devices within the IC. A sense point may be chosen at a particular location on the power grid and connected to a feedback input of the external voltage regulator. The sensed voltage on the power grid can then be compared by the voltage regulator to a specified "preset" voltage, and the regulator can adjust its output accordingly, in order to match the sensed voltage to the preset voltage. In many applications, having a feedback loop/mechanism involving the voltage regulator can be useful for dynamically providing the specified supply voltage to the electronic devices within the IC.

Although an external voltage regulator with the described feedback loop can maintain voltage of the IC power grid within a specified range, in some applications the feedback loop can be relatively slow and unresponsive relative to dynamically changing current loads within the IC. As a result, power supply voltages at electronic devices within the IC may temporarily deviate from the specified range until the external regulator can compensate for the changing current loads.

One or more on-chip voltage regulators may be used within an IC in order to provide a feedback loop/mechanism that is more responsive to dynamically changing current loads than an external voltage regulator. Such on-chip voltage regulators may be placed at various locations within the IC to provide local, dynamic regulation for specific portions or "sectors" of the IC. A number of types of on-chip IC voltage regulation schemes may be implemented, depending on the particular voltage regulation needs of the electronic devices within the IC.

For example, one type of voltage regulation scheme involves a single regulator, or group of distributed regulators with common controls, regulating, through the use of one sense point, the voltage within a single portion or sector of the IC. This scheme may be referred to as "Single-Sector Single-Sense" (SSSS). This scheme can be relatively simple to implement, and can provide local voltage regulation for the IC using a single sense point within the sector to represent to the regulator the voltage being received at electronic devices within that sector.

Another type of voltage regulation scheme involves a single regulator, or group of distributed regulators with common controls, regulating, through the use of multiple sense points, the voltage within a single sector of the IC. This scheme may be referred to as "Single-Sector Multi-Sense" (SSMS). This scheme can be somewhat more complex to implement than the SSSS scheme, and can provide local voltage regulation for the IC using multiple sense points within the sector to represent to the regulator the voltage being received at electronic devices within that sector. In some applications the regulator can use the lowest voltage received from the multiple sense points, and adjust its output voltage accordingly, in order to ensure that the devices at the lowest voltage sense point are supplied with at least the minimum specified operating voltage. In some applications, an SSMS scheme can provide an overall lower voltage gradient across a power distribution grid than a SSSS scheme.

Another type of voltage regulation scheme involves one or more regulators, or group of distributed regulators with common controls, regulating, through the use of multiple sense points, the voltage within multiple sectors of the IC. This scheme may be referred to as "Multi-Sector Multi-Sense" (MSMS). Each sector in an MSMS scheme can be controlled independently to minimize gradients within and between different sectors of the IC. This scheme can be somewhat more complex to implement than the SSSS or SSMS schemes, but in some applications, an MSMS scheme can provide an overall lower voltage gradient across a power distribution grid than the SSSS or SSMS schemes.

While each of the above-described schemes has particular advantages and disadvantages for certain applications, the accuracy and efficiency of each of them depends heavily upon the choice of location of one or more sense points used to feed back voltages to the regulator(s) within the IC voltage regulation system. The choice of an optimal sense point location can reduce voltage gradients across the power distribution grid and can be a key to achieving relatively uniform voltage distribution. Ideally, the location(s) of the sense point(s) are near to the areas of high current draw within the IC.

The effects of using various possible sense point locations within the IC can be evaluated using a non-linear device-level simulator such as SPICE (Simulation Program with Integrated Circuit Emphasis). Models for electronic devices drawing current as well as models for the power distribution grid can be created, evaluated, and simulated using such a non-linear simulator. However, such a simulation approach can be relatively costly in terms of implementation and execution time, and therefore may not be useful for IC design optimization. As an example, a single SPICE simulation for a chip-level power distribution network may take approximately seven days, which can effectively limit the number of candidate sense point location choices which may be evaluated. In addition, creating and verifying SPICE device-level models may consume additional time, in some applications several weeks or more.

Embodiments of the present disclosure include a simplified voltage regulation evaluation method using a variable resistance modeling technique for a linear circuit simulator. Such a method can achieve low simulation turnaround time (TAT) while simulating a linear regulator system. The iterative method is devised to rapidly calculate the steady-state voltage behavior of a sector of an IC and identify optimum sense point locations within the sector. The method supports the SSSS, SSMS and MSMS sensing and regulation schemes and can provide accurate results for a variety of simulated IC workload scenarios. The method can use an optimization algorithm and produce four performance metrics that can be useful in evaluating possible sense point locations.

According to embodiments, the method maintains the minimum specified device supply voltage, $V_{MIN}$ at a sense point, within a specified tolerance, $E_{TOL}$, of a target voltage, $V_{TARGET}$, which can ensure proper operation of electronic devices connected to the power grid. According to embodiments, the maximum voltage, $V_{MAX}$, can be limited to a specified value. This method is flexible enough to allow designers to perform 'what-if' analyses and fast enough to provide accurate results with approximately 100× improvement in TAT relative to a nonlinear circuit simulator such as SPICE.

Certain embodiments relate to rapid, efficient and accurate analysis of a linear power distribution model of an IC, and the evaluation of voltage regulator performance using well-defined metrics. FIG. 1A is a schematic that depicts a linear power distribution model of an IC 100, according to embodiments of the present disclosure. A linear power distribution model 100 may be used in conjunction with a linear circuit simulator, in order to rapidly simulate and evaluate the performance of various IC power grid voltage regulation and sense point placement schemes. According to embodiments, the linear power distribution model 100 can be used to represent a steady-state condition of a portion of the IC.

Linear power distribution model 100 may have certain advantages over non-linear circuit simulation models such as SPICE circuit models. For example, elements of linear power distribution model 100 such as voltage sources, current sources, and resistors can be significantly simpler and faster to both create, verify and simulate than corresponding non-linear circuit models. A linear power distribution model 100 may be created, for example, through the use of a schematic capture program or through automatic extraction from a completed chip layout. In general, a linear simulator may perform faster than a non-linear simulator due to simplified calculation algorithms and a lack of computationally intensive "convergence algorithms" employed by non-linear simulators. Experimental results can indicate that a linear power grid simulation program can produce output results approximately 100× faster than a nonlinear circuit simulation program, e.g., SPICE, with comparable accuracy.

Linear power distribution model 100 includes an input side power grid 102, a set of voltage regulator equivalent resistances 104 and an output side power grid 106. Input side power grid 102 includes a voltage source $V_{IN}$ at the chip input 114 connected by resistors 108 to the voltage regular equivalent resistances 104. Voltage source 114 represents the voltage supplied to an IC, for example through a connection of the IC to a voltage source/conductor of a printed circuit board (PCB). In applications, voltage source $V_{IN}$ 114 may be, for example, a switching power supply of a computer system. Resistors 108 represent conductive segments, i.e., chip wires, of an IC power grid, which can be used to electrically connect the voltage source $V_{IN}$ 114 to the set of voltage regulator equivalent resistances 104. In general, the input side power grid 102 and the output side power grid 106 each represent a complex network of interconnected resistances. For ease of illustration, FIG. 1A includes a simplified depiction of these complex networks.

Figure 1B:
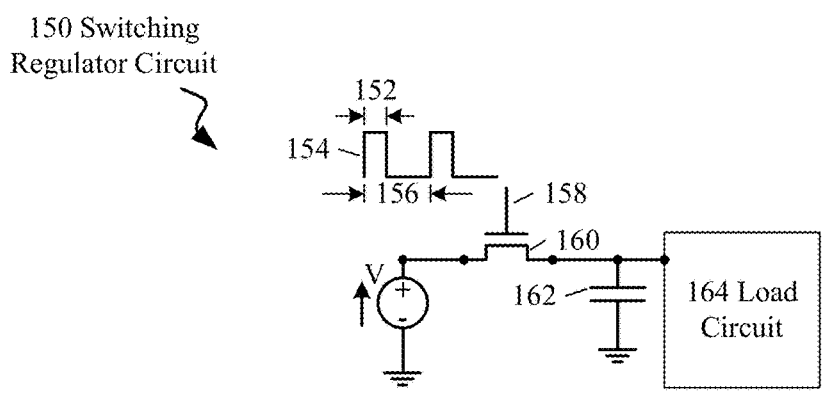
FIG. 1B is a schematic that depicts a switching regulator circuit of an IC, according to embodiments.

Voltage regulator equivalent resistances 104 include a set of variable resistances 110 that are interconnected to the output side power grid 106 by a corresponding set of resistors 108. Variable resistances 110 can be useful as a simplified electrical model of the various types of voltage regulator circuits. For example, a resistance value assigned to the variable resistances 110 may represent or correspond to a signal used to control or modulate a set of voltage regulator circuits or modules within the IC. Such voltage regulator designs may include, but are not limited to a switching regulator circuit, as depicted in FIG. 1B. In some embodiments, the resistance values of variable resistance 110 may all be identical, and in some embodiments the resistance values of the variable resistances 110 may each be unique.

Output side power grid 106 includes a mesh of resistors 108 used to interconnect the voltage regulator equivalent resistances 104 current sources 112. Resistors 108 can be useful as a simplified electrical model of a power distribution structure of an IC, such as a multi-level interconnected mesh of conductive wires. In some embodiments, current sources 112 can be useful as a simplified representation of steady-state current draw from active electronic devices such as logic gates, logic macros or analog circuits within the IC. Current draw values assigned to current sources 112 may be received from a designer, and/or from an IC power simulation program that is used to estimate power consumption of various portions of the IC. According to embodiments, current draw values assigned to current sources 112 can represent a maximum, peak, or "worst case" current draw of the corresponding section of circuitry. In some embodiments, current sources 112 can be replaced with a conductive circuit element with linear resistivity characteristics, such as a resistor.

Output side power grid 106 also includes sense point location 116. According to embodiments, sense point location 116 can be received from a designer by the linear circuit simulator. Sense point location 116 can be at least partially based upon IC power simulation results. For example, an IC power simulator may analyze power consumption of a local portion of an IC, and indicate a region or location corresponding to the highest power consumption within the region. In some embodiments, a location of the sense point of the IC can be within a sector of the IC. In some embodiments, the sense point location 116 can be assigned a random location within the linear power distribution model of the IC, as determined by the linear power grid simulation program.

FIG. 1B is a schematic depicting a switching regulator circuit 150 of an IC, according to embodiments. Switching regulator circuit 150 includes a voltage source V, a field-effect transistor (FET) 160 and a capacitor 162, connected to a load circuit 164.

Switching regulator circuit 150 can be understood to be one example of a linear voltage regulator circuit which may be located within an IC, and may be useful for locally regulating a supply voltage of a portion of the IC. This example is not limiting however; other types of voltage regulating circuits may be employed within an IC. Load circuit 164 is used in FIG. 1B to represent one or more active devices, such as digital logic macro functions or analog circuit functions within an IC.

Power gating signal 154 can be input to FET gate input 158 and used to alternately activate and deactivate FET 161, in order to maintain a specified voltage on capacitor 162 and at load circuit 164. The duty cycle of power gating signal 154 may be understood to be the ratio of active time interval 152 to the period 156 of power gating signal 154. A larger duty cycle, for example, one approaching 100% of power gating signal 154, can result in a higher voltage on capacitor 162, whereas a smaller duty cycle, for example one approaching 50%, can result in a lower voltage on capacitor 162. A value of variable resistance 110, FIG. 1A, may correspond to, and be useful for modeling of, the electrical effect of the duty cycle of power gating signal 154. For example, a larger value of variable resistance 110, FIG. 1A, may correspond to a larger duty cycle, while a smaller value of variable resistance 110 may correspond to a smaller duty cycle.

The correspondence between the value of a variable resistance 110 and a duty cycle of a switching regulator circuit is a simplified, non-limiting example of, modeling of voltage regulator controls. Other types of voltage regulator circuits may employ other types of control signals, for example a time-varying analog voltage, or a frequency-modulated signal.

Capacitor 162 can be used to filter/smooth the voltage intermittently applied from voltage source V, through FET 160, to load circuit 164. According to embodiments, load circuit 164 may correspond to, and be modeled by, current source(s) 112, FIG. 1A. In some embodiments, load circuit 164 may include additional capacitance useful for voltage filtering. Such capacitance may be an artifact of load circuit 164, or may be intentionally designed in for supply voltage filtering.

Figure 2:
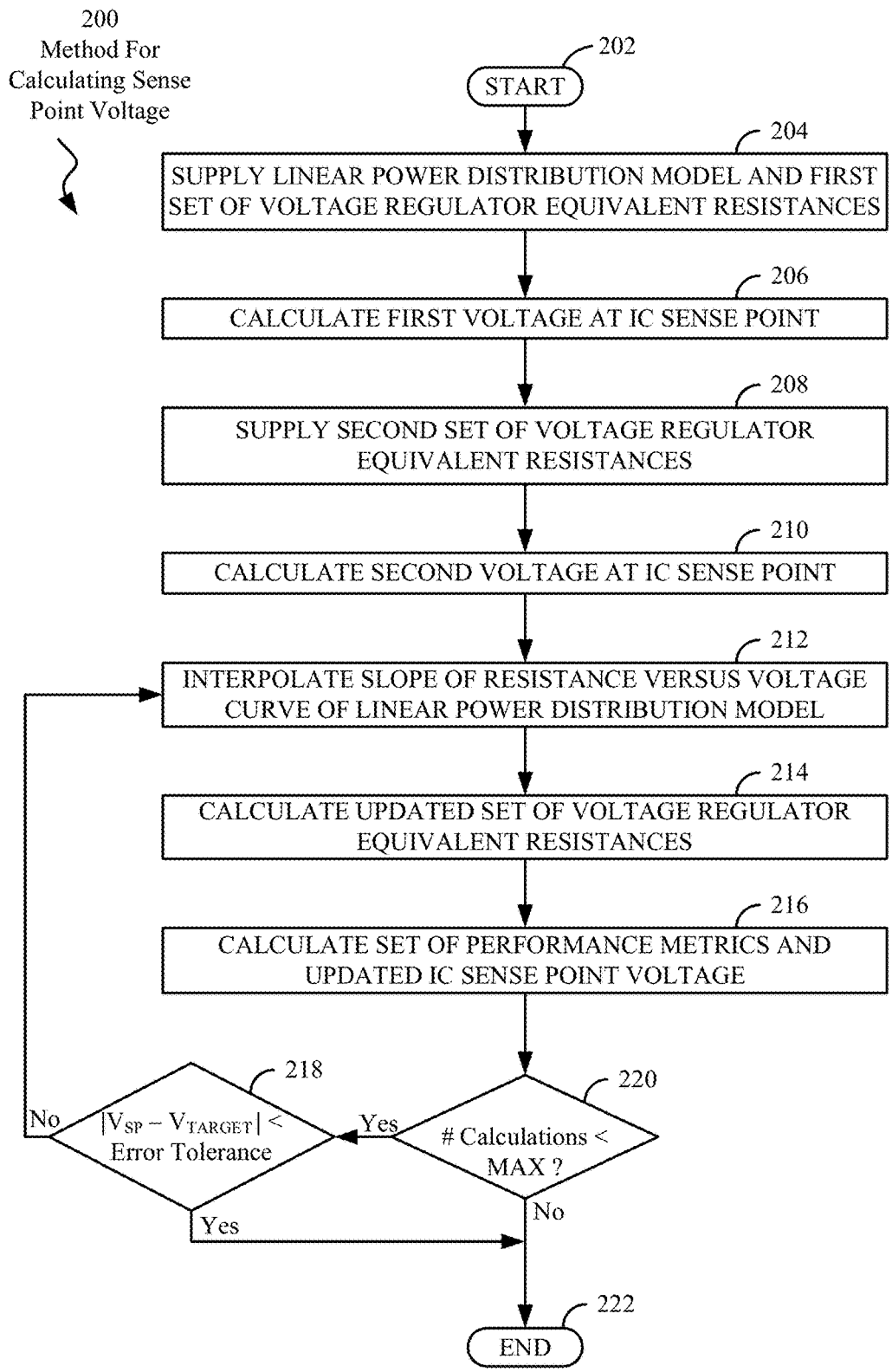
FIG. 2 is a flow diagram that depicts a method for calculating a sense point voltage, according to embodiments.

FIG. 2 is a flow diagram 200 depicting a method for calculating a sense point voltage, according to embodiments consistent with the figures. The operations of method 200 may generally be consistent with the depiction of the linear power distribution model of an IC 100, provided by FIG. 1A and its associated description. The process 200 moves from start 202 to operation 204.

Operation 204 generally refers to supplying, to a linear circuit simulator, a linear power distribution model of IC and a first set of voltage regulator equivalent resistances. According to embodiments, a linear power distribution model of an IC may be generated from an IC layout extraction tool, or may be output from a schematic capture program. The linear power distribution model may be imported into the linear circuit simulator in a form of a netlist or other computer-readable data file. The first set of voltage regulator equivalent resistances may be input by a designer through a user interface into the linear circuit simulator, or may be imported in a form of a netlist or other computer-readable data file. In embodiments, of the first set of voltage regulator equivalent resistances may be determined by a designer or may be generated from an IC layout modeling program. In some embodiments, all voltage regulator equivalent resistances of the first set of voltage regulator equivalent resistances may have an identical value. In some embodiments, some of the voltage regulator equivalent resistances may have unique values. Once a linear power distribution model of an IC and a first set of voltage regulator equivalent resistances are supplied to the linear circuit simulator, the process moves to operation 206.

Operation 206 generally refers to calculating a first voltage at the sense point of an IC. In embodiments, the linear circuit simulator applies a set of numerical methods to the supplied linear power distribution model, the first set of voltage regulator equivalent resistances and a value of a chip power supply input voltage, in order to calculate the first voltage at the sense point of an IC. In embodiments, an initial position of the sense point can be obtained from a designer or can be randomly assigned by the linear circuit simulator. Once the first voltage is calculated, the process moves to operation 208.

Operation 208 generally refers supplying a second set of voltage regulator equivalent resistances to the linear circuit simulator. The second set of voltage regulator equivalent resistances may be input by a designer through a user interface into the linear circuit simulator, or may be imported in a form of a netlist or other computer-readable data file. In embodiments, of the second set of voltage regulator equivalent resistances may be determined by a designer or may be generated from an IC layout modeling program. In some embodiments, all voltage regulator equivalent resistances of the second set of voltage regulator equivalent resistances may have an identical value. In some embodiments, some of the second set of voltage regulator equivalent resistances may have unique values. Once the second set of voltage regulator equivalent resistances is will supplied, the process moves to operation 210.

Operation 210 generally refers to calculating a second voltage at the sense point of an IC. In embodiments, the linear circuit simulator applies a set of numerical methods to the supplied linear power distribution model, the second set of voltage regulator equivalent resistances and a value of a chip power supply input voltage, in order to calculate the second voltage at the sense point of an IC. Once the second voltage is calculated, the process moves to operation 212.

Operation 212 generally refers to interpolating the slope of a resistance vs. voltage curve of the linear power distribution model. According to embodiments, the first set and the second set of voltage regulator equivalent resistances and the first and second voltages calculated at the sense point of the IC are used in a calculation of the slope of the resistance versus voltage curve of the linear power distribution model. This slope can be useful for estimating a subsequent set of voltage regulator equivalent resistances, in order to assist the linear circuit simulator in arriving at a sense point voltage that is within an acceptable error tolerance of a target voltage. Once the slope is interpolated, the process moves to operation 214.

Operation 214 generally refers to calculating an updated set of voltage regulator equivalent resistances. The slope calculated in operation 212 may be used in conjunction with previous voltage regulator equivalent resistance and calculated sense point voltage values, in order to arrive at an estimated set of voltage regulator equivalent resistances that yield a sense point voltage that approaches a sense point voltage target value, $V_{TARGET}$. Once the voltage regulator equivalent resistance values are calculated, the process moves to operation 216.

Operation 216 generally refers to calculating a set of performance metrics and an updated IC sense point voltage. According to embodiments, the linear circuit simulator is used to calculate a set of performance metrics which can be useful to a designer in evaluating a particular power regulation scheme. In embodiments the four metrics include:

$V_{MIN}$=a minimum voltage (of all nodes evaluated in the linear power distribution model)

$V_{MAX}$=a maximum voltage (of all nodes evaluated in the linear power distribution model)

Min-Max gradient=$V_{MAX}-V_{MIN}$ $$AvgError = \frac{\sum_{n=1}^{N} |V_n - V_{TARGET}|}{N}$$

Where:

N represents the total number of nodes in the power grid $V_{TARGET}$ represents a specified target voltage for the sense point $V_n$ represents individual voltages at nodes in the power grid According to embodiments, $V_{MIN}$ can be a useful metric for comparison of a minimum voltage of all evaluated power grid nodes against a specified minimum power supply voltage necessary for proper operation of electronic circuits within the IC. Similarly, $V_{MAX}$ can also be a useful metric for comparison against a maximum specified power supply voltage for electronic circuits. $V_{MIN}$ and $V_{MAX}$ can together provide an IC designer with a way to quickly compare simulated power grid voltages against a specified power supply operating range for electronic devices within the IC. According to embodiments, the Min-Max gradient can be used to producing a voltage gradient plot, which may be useful, to an IC designer, as a way of visualizing power distribution grid simulation results. In embodiments, the AvgError metric can provide an IC designer with a useful quantitative measurement of the deviation of all the evaluated power supply node voltages from $V_{TARGET}$. Such a metric can be a useful, concise measurement of the overall distribution of power supply grid voltages between $V_{MIN}$ and $V_{MAX}$. In embodiments, each of these performance metrics can be calculated for the SSSS, SSMS and MSMS voltage regulation schemes. Once the updated set of performance metrics and updated IC sense point voltage are calculated, the process moves to operation 220.

At operation 220 a determination is made regarding a maximum number of calculations/iterations of the method 200. In embodiments, a maximum number of calculations for the method 200 may be specified by a user to the linear circuit simulator. A maximum number of calculations/iterations may be useful in limiting the amount of computational resources applied to optimizing the power grid distribution, while still providing accurate results. If the number of calculations performed is less than the user-specified maximum number of calculations, the process moves to operation 218. If the number of calculations performed is equal to or greater than the user-specified maximum number of calculations, the process 200 may end at block 222.

At operation 218 a determination is made regarding a comparison between the difference between a measured sense point voltage and a specified target voltage, $V_{TARGET}$, and a user-defined error tolerance, $E_{TOL}$. According to embodiments, the difference between voltage at the sense point, Vsp and target voltage, Vtarget is computed during each iteration of the method 200. Computing the difference between Vsp and Vtarget, and comparing this difference to $E_{TOL}$ can be useful in creating a criterion on which to decide whether to continue the calculations or not. The error tolerance $E_{TOL}$ may be set by a user to be sufficiently small so that if the difference between Vsp and Vtarget is less than the $E_{TOL}$, additional simulations may not be deemed necessary by the user. Similar to operation 220, operation 218 can be useful for limiting computational resources applied to linear power grid simulation activity. If the difference between Vsp and Vtarget is greater than or equal to the $E_{TOL}$, the process returns to operation 212. If the difference between Vsp and Vtarget is less than the $E_{TOL}$, the process 200 may end at block 222.

According to embodiments, the method 200 may iterate by returning from operation 218 to operation 212, and using an updated set of voltage regulator equivalent resistances, calculated in operation 214 to re-interpolate the slope of the resistance versus voltage curve in operation 212. In some embodiments, the number of iterations to reach an acceptable solution, within either the user-specified iteration count or error tolerance can vary, depending on a specified value of the error tolerance. In some embodiments, for example, a solution can be reached in two iterations, and in some embodiments 10 or more iterations may be run to reach a solution.

Various aspects of the present disclosure may be useful for providing rapid, accurate evaluation of linear power distribution models of on-chip power distribution networks. A linear circuit simulator configured according to embodiments of the present disclosure may provide an IC designer with linear power grid evaluation results with significantly faster TAT than can be achieved by using comparable non-linear circuit simulator. The rapid TAT provided by embodiments can allow an IC designer to simulate and explore a number of on-chip power distribution schemes and regulation scenarios, which can be useful for optimizing sense point locations within an IC. Such sense point location optimization can result in highly precise on-chip voltage regulation, which may result in on-chip electronic devices and circuits receiving supply voltages within a specified range. Embodiments can be useful in creating a uniform supply voltage distribution across at least a portion of an IC.

Embodiments of the present disclosure provide simplified linear power grid modeling by replacing non-linear models with simpler linear models. According to embodiments, linear power grid distribution modeling results can be produced approximately 100× faster than comparable results from a non-linear circuit simulator such as SPICE.

According to embodiments, matrix manipulation techniques may be used within the linear circuit simulator in order to generate an updated set of voltage regulator equivalent resistances, a set of performance metrics and an updated sense point voltage. Such techniques may be used to subdivide a simulation coefficient matrix that represents the linear power distribution model of the IC and the sets of voltage regulator equivalent resistances. Generating an updated set of voltage regulator equivalent resistances, a set of performance metrics and an updated sense point voltage through the use of matrix manipulation techniques within the linear circuit simulator may be useful for accelerating the process of evaluating voltage regulation schemes within a portion of an IC. Such acceleration may provide an IC designer with enhanced opportunities for "what-if" analysis of various voltage regulation schemes and sense point locations, which can result in enhanced accuracy and efficiency of on-chip voltage regulation. According to embodiments, the use of matrix manipulation techniques within the linear circuit simulator can produce sense point voltages and performance metrics with accuracy comparable to those produced by "full" circuit simulation runs of the linear circuit simulator.

Figure 3:
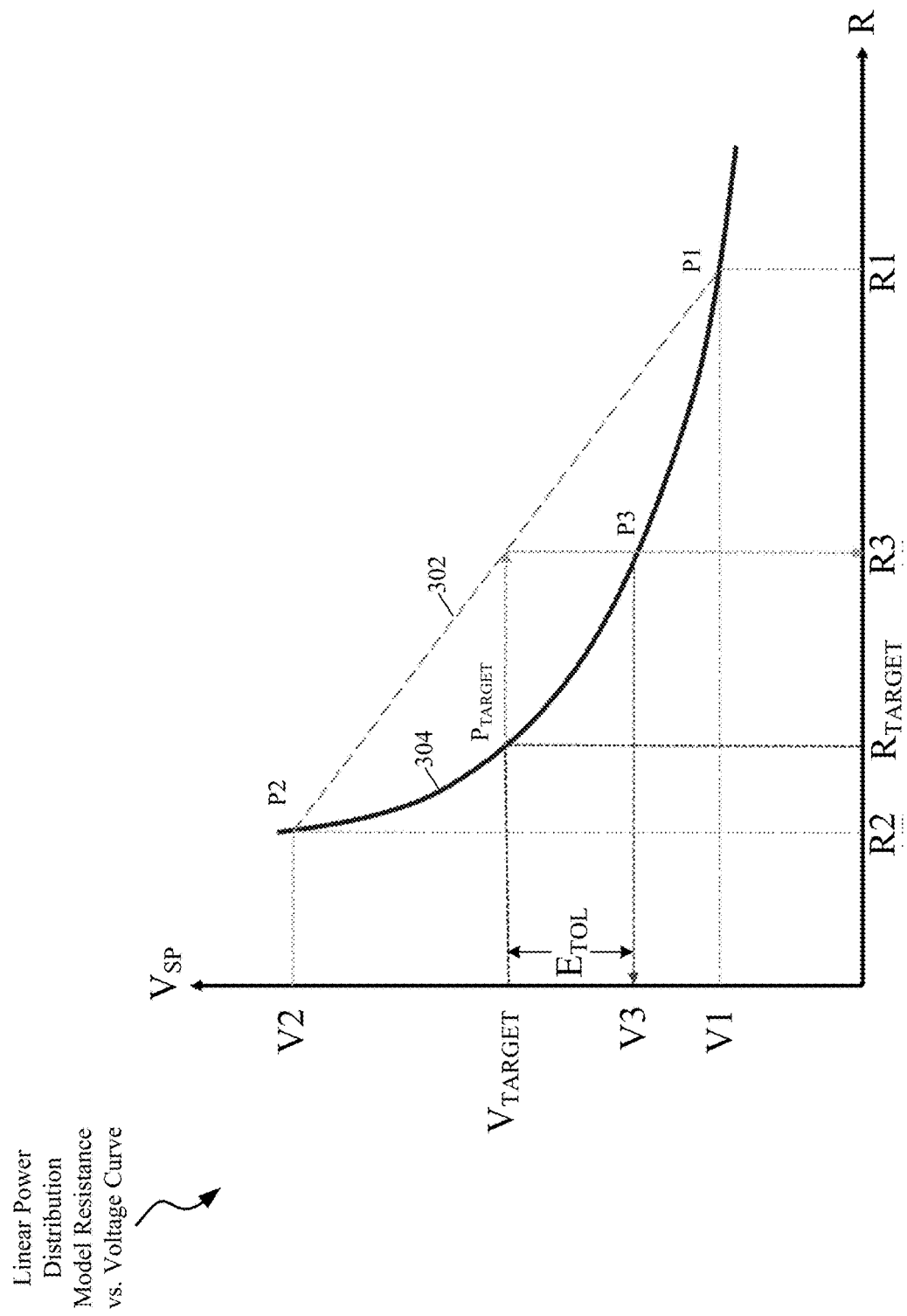
FIG. 3 is a graph depicting a resistance vs. voltage curve of a linear power distribution model, according to embodiments.

FIG. 3 is a graph depicting a resistance vs. voltage curve 304 of a linear power distribution model, according to embodiments. The voltages, resistances and relationships between voltages and resistance as depicted in FIG. 3 correspond to, and are consistent with, the method 200 of FIG. 2.

The resistance axis R includes a first voltage regulator equivalent resistance R1, a second voltage regulator equivalent resistance R2, a third, updated, voltage regulator equivalent resistance R3, and a target resistance $R_{TARGET}$. Similarly, the sense point voltage axis $V_{SP}$ includes a first calculated sense point voltage V1, a second calculated sense point voltage V2, a third, updated, calculated sense point voltage V3, and a target sense point voltage $V_{TARGET}$. Points P1, P2, P3 and $P_{TARGET}$ on curve 304 represent operating points of the linear power distribution model at particular pairings of voltage regulator equivalent resistances and corresponding calculated sense point voltages resulting from linear power grid simulations.

In accordance with FIG. 2 and its associated description, a pair of initial voltage regulator equivalent resistances, R1 and R2 may be used as input to a linear circuit simulator, resulting in corresponding sense point voltages V1 and V2. The interpolation between corresponding operating points P1 and P2 is represented by line 302. The slope of line 302 can be used, along with the differences between V1, V2 and $V_{TARGET}$ to estimate an updated voltage regulator equivalent resistance R3.

As depicted, simulating the linear power distribution grid with voltage regulator equivalent resistance R3 can result in a simulated sense point voltage V3, which is within the error tolerance $E_{TOL}$ of $V_{TARGET}$. At this point, the simulations would end, as a sense point voltage simulation result, V3, has been achieved that is within an error tolerance $E_{TOL}$ of the target sense point voltage $V_{TARGET}$.

According to embodiments, should the power grid simulation yield a sense point voltage that is not within the error tolerance $E_{TOL}$ of $V_{TARGET}$, the line 302 can be adjusted between a newly calculated operating point and a previously calculated operating point, in order to converge on another operating point having a sense point voltage within the error tolerance $E_{TOL}$ of $V_{TARGET}$. In embodiments, the line 302 may be adjusted during each iteration of the linear power grid simulations until a sense point voltage is calculated that is within the error tolerance $E_{TOL}$ of $V_{TARGET}$, or until the maximum number of calculations/iterations is exceeded.

Figures 4A, 4B:
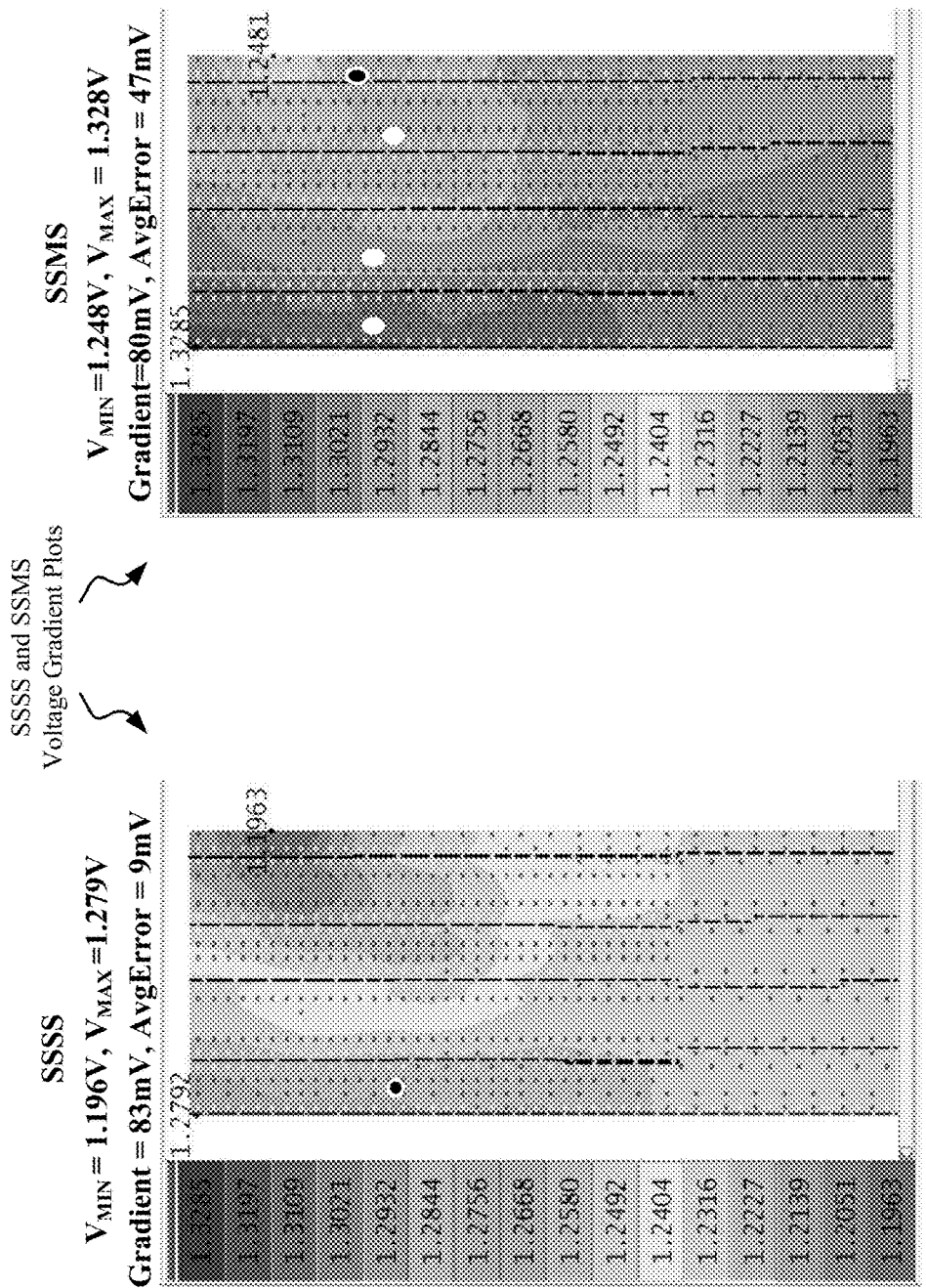
FIG. 4A is a plot depicting a voltage gradient of an IC using a Single-Sector Single-Sense (SSSS) voltage regulation scheme, according to embodiments.
FIG. 4B is a plot depicting a voltage gradient of an IC using a Single-Sector Multi-Sense (SSMS) voltage regulation scheme, according to embodiments.
Figures 5A, 5B:
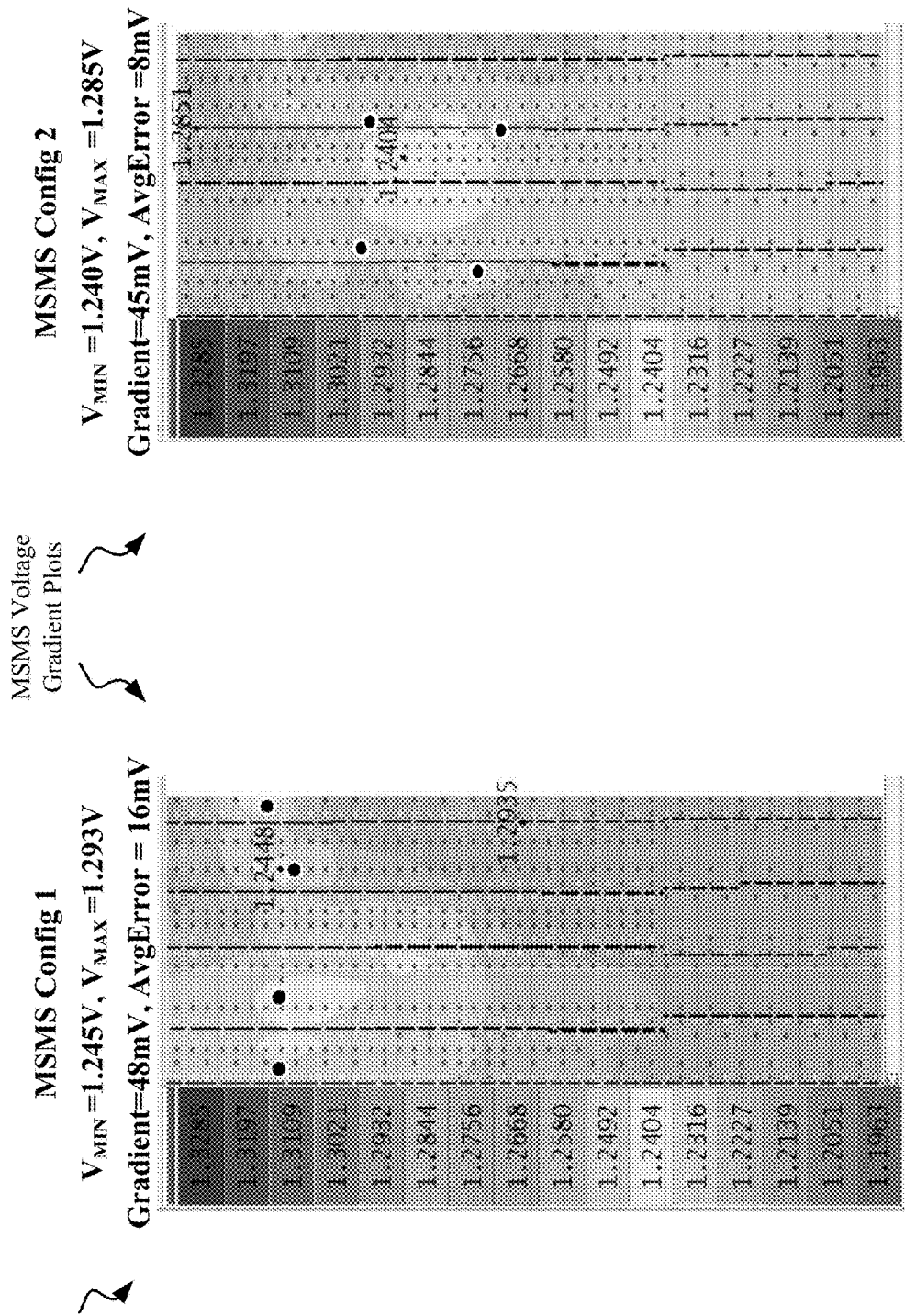
FIG. 5A is a plot depicting a voltage gradient of an IC using a Multi-Sector Multi-Sense (MSMS) voltage regulation scheme, according to embodiments.
FIG. 5B is a plot depicting a voltage gradient of an IC using an MSMS voltage regulation scheme, according to embodiments.

FIG. 4A is a plot depicting a voltage gradient of an IC using an SSSS voltage regulation scheme, according to embodiments. FIG. 4B is a plot depicting a voltage gradient of an IC using an SSMS voltage regulation scheme, according to embodiments. FIG. 5A and FIG. 5B are plots depicting a voltage gradient of an IC using two MSMS voltage regulation schemes, according to embodiments.

The FIGS. 4A, 4B, 5A and 5B represent voltage gradient plots that display the results of linear power grid simulations run on a sector of an IC. The voltage at the IC power supply input was set to 1.45 V and the $V_{TARGET}$ voltage was set to 1.25 V. The voltage gradient plots in FIGS. 4A, 4B, 5A and 5B are adjusted to a common shading scale. The TAT for these simulations was less than 2 hours, as compared to the TAT for a comparable SPICE analysis which exceeded seven days.

While the metrics output by the power grid simulations vary, depending on the voltage regulation scheme employed, i.e., SSSS, SSMS or MSMS, each of the sets of outputs were rapidly and efficiently generated using a linear power grid simulation which employed a linear power distribution model of an IC.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method, implemented on the at least one processor circuit, the method comprising:

supplying, to a linear circuit simulator running on the at least one processor circuit, a linear power distribution model of an integrated circuit (IC) and a first set of voltage regulator equivalent resistances, all voltage regulator equivalent resistances of the first set of voltage regulator equivalent resistances having identical values, and the voltage regulator equivalent resistances of the first set of voltage regulator equivalent resistances corresponding proportionally to a duty cycle of a switching regulator providing a direct current (DC) supply voltage to a portion of the IC, the first set of voltage regulator equivalent resistances being input by a designer, through a user interface, into the linear circuit simulator, the duty cycle of the switching regulator being a ratio of an active time interval of the switching regulator to a period of a power gating signal;

calculating, with the linear circuit simulator running on the at least one processor circuit, a first DC steady-state voltage at a sense point located on a power grid of the IC, the first DC steady-state voltage corresponding to the first set of voltage regulator equivalent resistances;

supplying, to the linear circuit simulator running on the at least one processor circuit, a second set of voltage regulator equivalent resistances, the second set of voltage regulator equivalent resistances being different than the first set of voltage regulator equivalent resistances;

calculating, with the linear circuit simulator running on the at least one processor circuit, a second DC steady-state voltage at the sense point of the IC, the second DC steady-state voltage corresponding to the second set of voltage regulator equivalent resistances;

interpolating, with the at the least one processor circuit, using the first set and the second set of voltage regulator equivalent resistances and the first and second DC steady-state voltages at the sense point of the IC, a slope of a resistance versus voltage curve of the linear power distribution model;

calculating, with the at least one processor circuit, using the slope of the resistance versus voltage curve, an updated set of voltage regulator equivalent resistances, the updated set of voltage regulator equivalent resistances corresponding to a target DC steady-state voltage at the sense point of the IC;

calculating, with the linear circuit simulator running on the at least one processor circuit, the linear circuit simulator supplied with the updated set of voltage regulator equivalent resistances, a set of four performance metrics and an updated DC steady-state voltage at the sense point of the IC, the set of four performance metrics including a minimum voltage, a maximum voltage, a minimum to maximum voltage gradient and an average voltage error;

supplying, to the linear circuit simulator running on the at least one processor circuit, a third set of voltage regulator equivalent resistances and calculating, with the linear circuit simulator, a third DC steady-state voltage at the sense point of the IC, the third DC steady-state voltage corresponding to the third set of voltage regulator equivalent resistances; and generating, with the at least one processor circuit, a voltage gradient plot displaying a plurality of DC steady-state voltages corresponding to a plurality of sense points on the IC, the plot including at least the updated DC steady state voltage at the sense point of the IC.

* * * * *